United States Patent
Han et al.

(10) Patent No.: US 9,666,431 B1
(45) Date of Patent: *May 30, 2017

(54) LARGE-SCALE PATTERNING OF GERMANIUM QUANTUM DOTS BY STRESS TRANSFER

(71) Applicants: Sang M. Han, Albuquerque, NM (US); Talid R. Sinno, Philadelphia, PA (US)

(72) Inventors: Sang M. Han, Albuquerque, NM (US); Talid R. Sinno, Philadelphia, PA (US)

(73) Assignee: STC.UNM, Albuquerque, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/161,633

(22) Filed: May 23, 2016

Related U.S. Application Data

(63) Continuation of application No. 14/827,084, filed on Aug. 14, 2015, now Pat. No. 9,373,547.

(60) Provisional application No. 62/037,712, filed on Aug. 15, 2014.

(51) Int. Cl.
| | |
|---|---|
| *H01L 21/02* | (2006.01) |
| *H01L 51/00* | (2006.01) |
| *H01L 21/8234* | (2006.01) |
| *H01L 21/324* | (2006.01) |
| *B82Y 40/00* | (2011.01) |

(52) U.S. Cl.
CPC .. *H01L 21/02601* (2013.01); *H01L 21/02532* (2013.01); *H01L 21/02546* (2013.01); *H01L 21/02631* (2013.01); *H01L 21/3245* (2013.01); *B82Y 40/00* (2013.01); *Y10S 977/774* (2013.01); *Y10S 977/814* (2013.01); *Y10S 977/819* (2013.01); *Y10S 977/891* (2013.01)

(58) Field of Classification Search
CPC .......... H01L 21/02601; H01L 29/0665; H01L 29/125; H01L 29/413; H01L 51/0046
See application file for complete search history.

(56) References Cited

U.S. PATENT DOCUMENTS

| | | | |
|---|---|---|---|
| 9,373,547 B1 * | 6/2016 | Han | H01L 21/823493 |
| 2011/0272744 A1 | 11/2011 | Ning et al. | |

* cited by examiner

*Primary Examiner* — Hoai V Pham
(74) *Attorney, Agent, or Firm* — MH2 Technology Law Group LLP

(57) ABSTRACT

Provided is a method for forming a two-dimensional array of semiconductor quantum confined structures. The method includes providing a layer that has first atoms and second atoms, the first atoms having a different size than the second atoms; providing an indenter template that includes at least one indenter structure extending from a surface of the indenter template; contacting the layer and the at least one indenter structure together with a pressure sufficient to generate an elastic deformation in the layer but without generating plastic deformation of the layer; annealing the layer. The contacting of the layer and the at least one indenter structure includes forming at least one quantum confined structure in the layer.

21 Claims, 9 Drawing Sheets

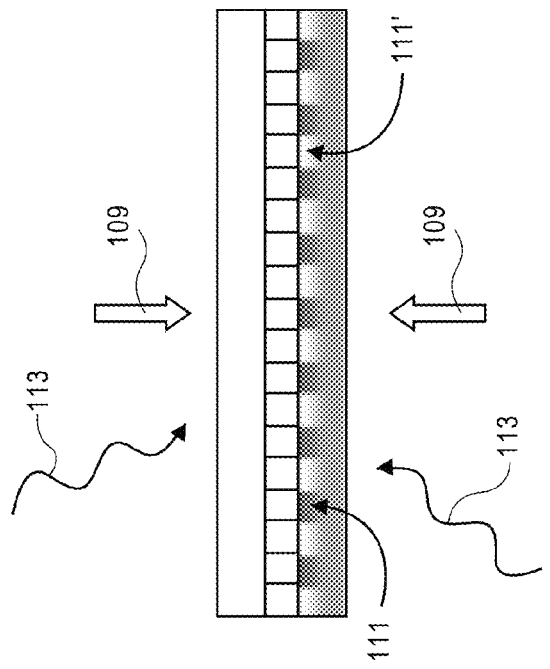
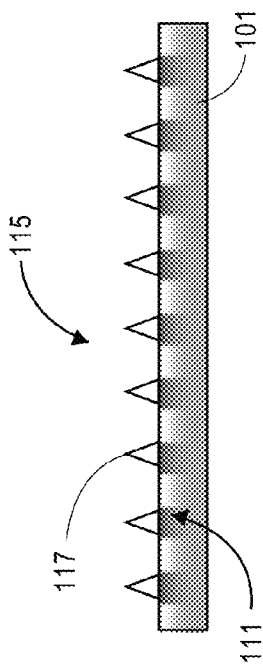
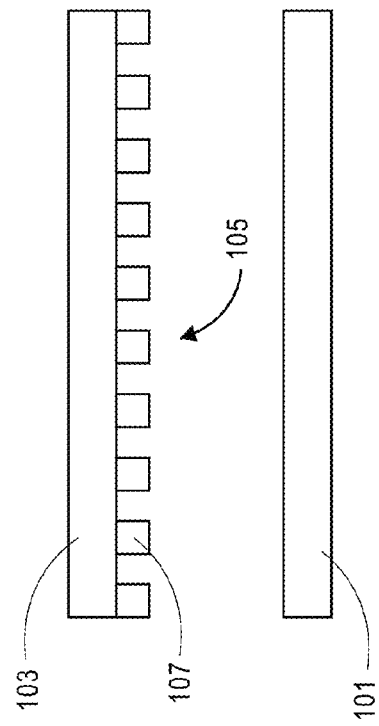
FIG. 1A
FIG. 1B
FIG. 1C

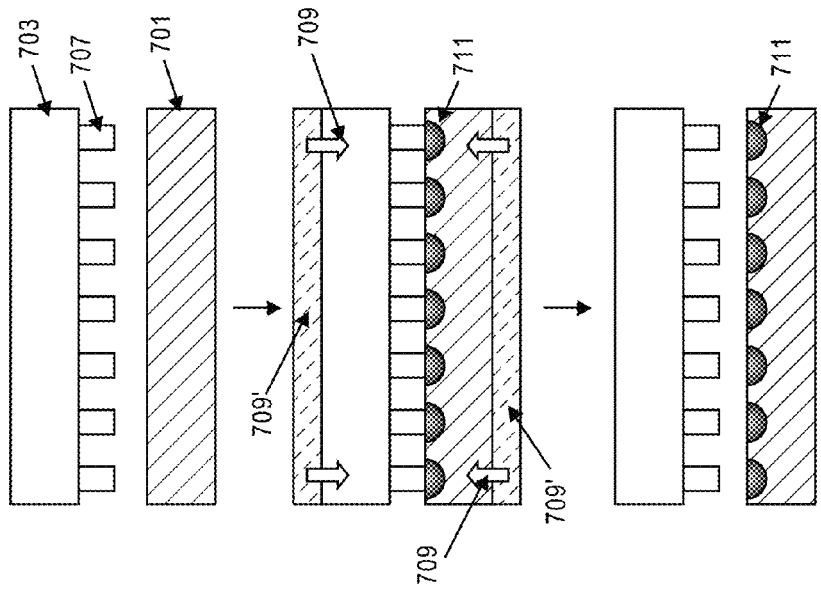
FIG. 7C
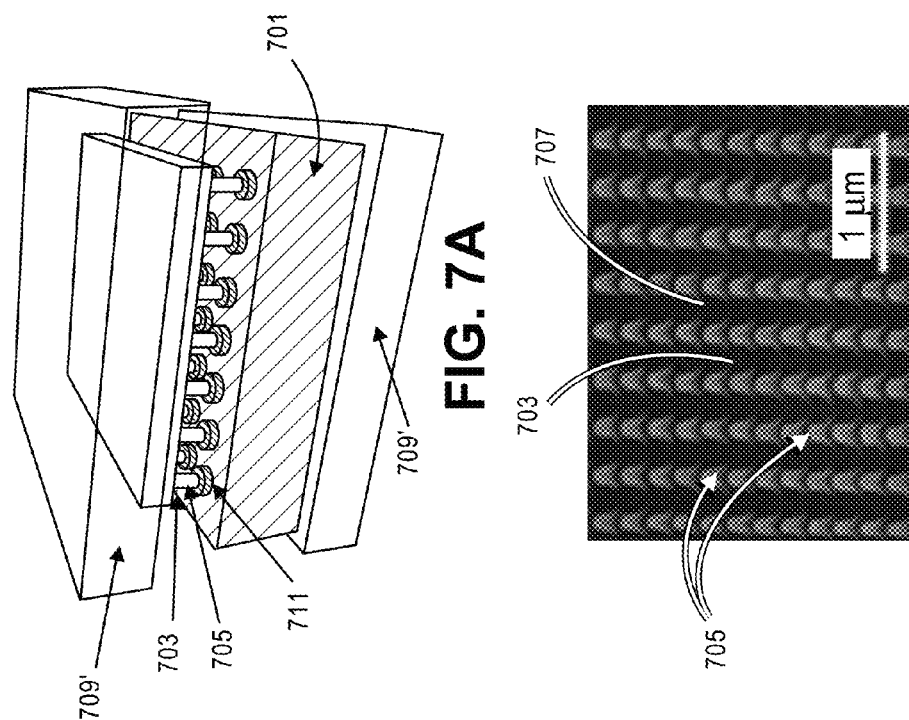
FIG. 7A
FIG. 7B

LARGE-SCALE PATTERNING OF GERMANIUM QUANTUM DOTS BY STRESS TRANSFER

CROSS-REFERENCE TO RELATED APPLICATIONS

This application is a continuation of U.S. patent application Ser. No. 14/827,084 filed Aug. 14, 2015, which claims priority to U.S. Provisional Patent Application Ser. No. 62/037,712, filed Aug. 15, 2014, the entireties of which are incorporated herein by reference.

GOVERNMENT RIGHTS

This disclosure was made with Government support under Contract No. CMMI1068970 and CMMI1068841 awarded by the National Science Foundation (NSF). The Government has certain rights in the invention.

FIELD

This disclosure is generally directed to a method of making quantum confined structures, for example, nanostructures, such as quantum wells and/or highly ordered two-dimensional arrays of quantum dots (QDs).

BACKGROUND

Nucleation and aggregation in atomic systems offer tremendous possibilities for making structures at the nanoscale that may be useful in a wide range of technologies, including nano and molecular electronics, high-density patterned media for data storage, optoelectronics, and nanosensor arrays. Examples of self assembly in atomic systems are ubiquitous in nature and technological applications and include precipitation of various phases in multi-component metallic alloys and island formation on crystalline semiconductor substrates. There has been much interest in utilizing the self-driving nature of nucleation and growth to produce nanostructures with precisely tailored size and/or spatial distributions.

The use of applied fields to pattern the nucleation and growth of microstructure within crystalline materials has been demonstrated. Technological interest in directed assembly within semiconductor hetero-systems stems in large part from the potential application of quantum dot arrays/superlattices in optoelectronics, spintronics, and quantum computing, and also in their potential integration with existing silicon complimentary metal-oxide semiconductor (CMOS) technology. A key requirement for such applications is accurate spatial positioning and size uniformity of clusters over a large area. Spatial control is required for addressability of each cluster, and in some applications (e.g. logic circuits), for building complex arrangements of dots into devices. Size uniformity is important because the quantum properties of a given nanocluster are sensitively dependent on the cluster size, strain state, and composition.

One highly promising example of a material system in which precise control of nanostructure formation would be highly desirable is the silicon/germanium (Si/Ge) heteroepitaxial system. Recent experimental effort has been directed towards development of approaches for spatial patterning of surface dots in the Si/Ge heteroepitaxial system. The most common approach has been to pre-pattern the substrate, either using traditional "top-down" approaches or by taking advantage of naturally self-assembled features. Examples of the latter include creating vicinal Si (100) surfaces to align dots at surface steps, employing the strain-field created by a planar misfit dislocation network at a relaxed $Si/Si_{1-x}Ge_x$ interface, and using undulations created by the Asaro-Tiller-Grinfeld instability to direct Ge dot formation. While attractive, owing to the limited substrate pre-processing required, these approaches are generally not able to produce device-quality ordering of Ge dots.

On the other hand, substrate pre-patterning by various lithographic methods has led to promising demonstrations of dot patterning in the Si/Ge heterosystem. Electron-beam lithography and reactive ion etching (ME) have been used successfully to generate periodic structures on Si surfaces which act to direct Ge dot formation. For example, SiGe island superlattices formed on etched trench arrays are able to transmit strain through multilayered heterostructures to produce ordered Ge dot arrays on a planar surface. Surface features including mesas and pits have been shown to provide strong driving forces for dot isolation, however, the influence of these complex geometries on the nucleation and growth of dots is not fully understood. Similar patterning has been observed using focused gallium ion beams to create locally preferential regions for subsequent formation of Ge islands. The primary drawbacks of these pre-patterning approaches are scalability of high-resolution lithography to large surface areas, and the additional steps required for planarizing the surface on which the dots are formed.

The growth of highly-ordered two-dimensional arrays of semiconductor quantum dots lends itself to a variety of technologically important applications, ranging from sensors, to data storage, to quantum computing. Finding a viable, cost-effective path for manufacturing ultra-high density arrays of uniform semiconductor quantum dots (with quantum confinement properties) on semiconductor substrates would be desirable.

SUMMARY

In an embodiment, there is a method for forming a two-dimensional array of semiconductor quantum confined structures. The method includes providing a layer comprising first atoms and second atoms, the first atoms having a different size than the second atoms; providing an indenter template comprising at least one indenter structure extending from a surface of the indenter template; contacting the layer and the at least one indenter structures together with a pressure sufficient to generate a elastic deformation in the layer but without generating plastic deformation of the layer; and annealing the layer. and the contacting includes forming at least one quantum confined structure in the layer.

In another embodiment, there is a method for forming a two-dimensional array of semiconductor quantum dots. The method includes providing a layer comprising first atoms and second atoms, the first atoms having a different size than the second atoms; providing an indenter template comprising a nanopatterned array of indenter structures extending from a surface of the indenter template; contacting the layer and the nanopatterned array of indenter structures together with a pressure sufficient to elastically deform portions of the layer but without generating plastic deformation of the layer; and annealing the layer. The layer includes a homogeneous compositional distribution of the first atoms and the second atoms before the contact and includes an inhomogeneous compositional distribution of the first atoms and the second atoms after the contacting.

Advantages of at least one embodiment include patterning of a substantially planar substrate without the need to generate complex surface structures (e.g., mesas, pits or trenches) thereon. An additional advantage of at least one embodiment includes the use of a single mold (i.e., the indenter template) that can be applied to different substrates multiple times which offers the possibility of forming nanostructures on substrates with higher throughput and lower cost.

Additional advantages of the embodiments will be set forth in part in the description which follows, and in part will be understood from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

BRIEF DESCRIPTION OF THE DRAWINGS

FIGS. 1A-1C are schematic representations of a process for forming patterned arrays of nanostructures according to an embodiment.

FIG. 7A-7B are views of a process for forming a 2D array of compositionally defined nanostructures according to an embodiment. FIG. 7A is a perspective view of a mechanical press assembly in which nanoindenters are caused to contact a layer, such as an SiGe substrate, FIG. 7B is a scanning electron microscope (SEM) image of a nanoindenter array and FIG. 7C is a process flow diagram for causing compositional redistribution according to an embodiment.

In FIG. 9A, the indenter template includes at least two indenter structures. In FIG. 9B, the indenter template includes at least one indenter structure comprising at least one window.

DETAILED DESCRIPTION OF THE EMBODIMENTS

Figure 2:
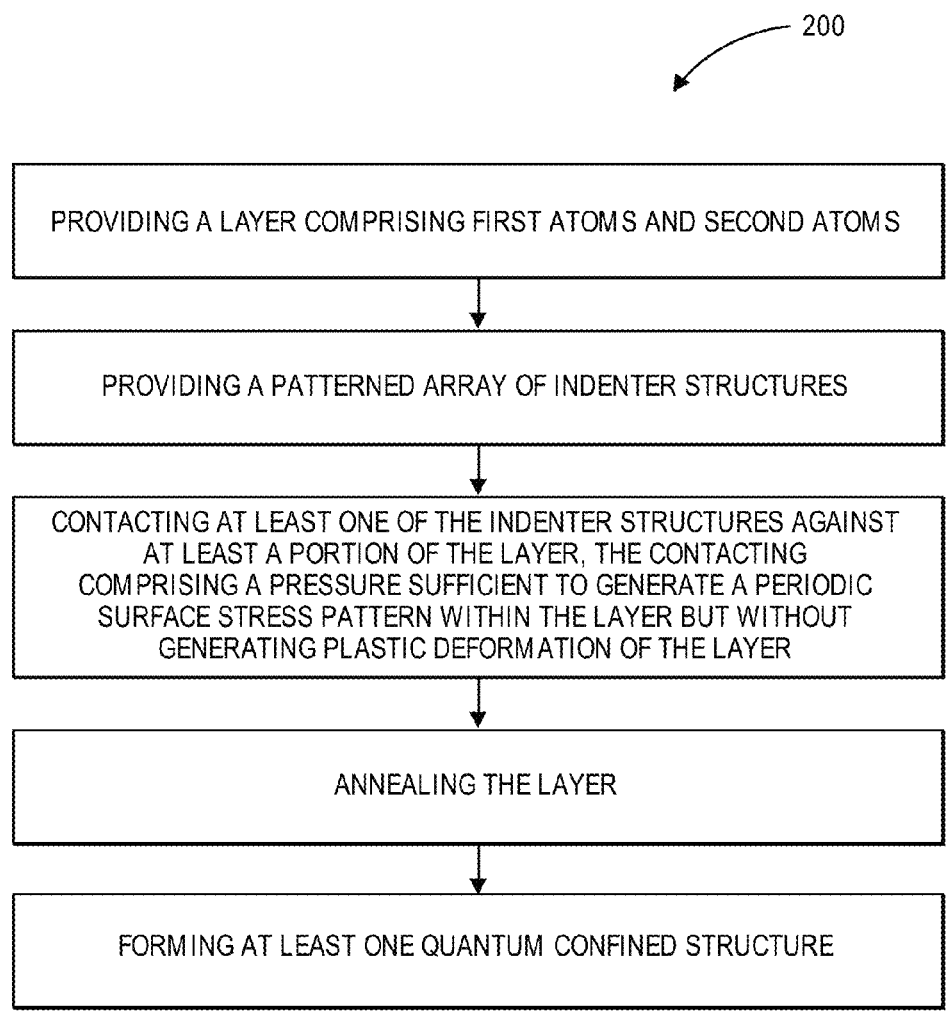
FIG. 2 is a flowchart describing the process for forming patterned arrays of nanostructures shown in FIGS. 1A-1C.

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

The following embodiments are described for illustrative purposes only with reference to the Figures. Those of skill in the art will appreciate that the following description is exemplary in nature, and that various modifications to the parameters set forth herein could be made without departing from the scope of the present invention. It is intended that the specification and examples be considered as examples only. The various embodiments are not necessarily mutually exclusive, as some embodiments can be combined with one or more other embodiments to form new embodiments.

Disclosed herein are methods that combine epitaxy (for growth-direction bandgap engineering) and precision lateral displacement of atoms (for lateral bandgap engineering) to produce quantum confined structures. The methods of the various embodiments provide for lateral compositional control (i.e., lateral variation in composition in layers, such as epitaxial layers) without the need for creating lattice mismatch between an epitaxially deposited film and an underlying substrate, as is the case of Stranski-Krastanov (SK) growth mode.

In an embodiment, quantum well structures, which may already be exhibiting confinement in one-dimension, are subjected to spatially-modulated stress fields that drive atomic displacement to create highly tailored compositional gradients in lateral directions of a layer, such as a heteroepitaxial layer. The stress fields can be induced by contacting at least one indenter structure to a surface portion of a layer that comprises first and second atoms, with the first atoms being of a different size than the second atoms. That is the first atoms may be larger atoms relative to the second atoms which may be smaller atoms (i.e., the first atoms having a larger atomic radius than that of the second atoms). Generally, such an embodiment may be described as a template-based method to form quantum confined structures, for example, nanostructures such as quantum dots and/or quantum wells, by stress transfer because compressive stresses in regions near the indenter structures diffusively drive the larger ones of the atoms of the layer away, and thereby create nearly pure regions of the smaller atoms surrounded by regions comprising both the first and second atoms and/or nearly pure regions of the larger atoms surrounded by regions comprising both the first and second atoms.

As a result of their diffusion to areas away from the indenters, such as elastically deformed surface portions of the layer, some of the first atoms (i.e., the larger atoms than the smaller, second atoms) of the layer can be arranged to form nanostructures such as quantum dots. Thus, one step for forming nanostructures may include physically pressing a reusable indenter template that includes an arrangement of indenters against a layer comprising first and second atoms, such as a heteroepitaxial semiconductor structure, for example, during a thermal annealing. In other words, the resulting compression, which may be combined with the thermal annealing, introduces a spatially varying compositional variation in the substrate due to the atomic size difference between the atoms of the layer that comprises first atoms and second atoms. This compositional variation and its associated surface strain field are then exploited to direct spontaneous assembly of quantum confined structures, for example, nanostructures, such as quantum wells and/or quantum dots. In one example, the quantum dots may be formed with or without the need for a subsequent deposition step. In an example, this process may be utilized to form a highly ordered, two-dimensional array of Ge nanostructures, such as Ge quantum dots, on a layer, such as on heteroepitaxial structure, for example an $Si_{1-x}Ge_x$ substrate. In an embodiment, the quantum dots may be grown on the surface of the layer by molecular beam epitaxy (MBE) after pressing. In an embodiment, the larger atoms may be arranged to form the quantum dots by virtue of a stress-induced pattern according to a design of the individual indenter structures and/or the arrangement of indenter structures in, for example, an array of indenter structures. Thus, indenter structure shape, pitch and array symmetry, along with force with which the indenter array is applied against the layer, may be preselected in order to form a desired arrangement of quantum dots.

Because of the reusability of the template, which is expensive to make due to the lithographic steps required, embodiments described herein offer potentially transformative cost-reductions in fabricating a well-defined two-dimensional (2D) array of nanostructures. Thus, in an example, the disclosed embodiments allow for controlling Ge growth in a well-defined nanoscale 2D array without forming dislocations, while requiring a high degree of uniformity across large areas. It is noted, however, that the methods described herein are not limited to structures comprising $Si_{1-x}Ge_x$ and may be applicable to other heteroepitaxial structures, such as epi-layers, for example, those comprising InGaAs.

A method of forming a stress patterned substrate and a method for forming nanostructures on or in the stress patterned substrate are shown in FIGS. 1A-1C and described in the flow chart 200 of FIG. 2. For example, a layer 101 and a patterned indenter template 103 are provided. The layer 101 may include first and second atoms, wherein the first atoms are a different size than the second atoms. In an example, the first atoms comprise larger atoms relative to the second atoms which comprise smaller atoms. The first and second atoms may be homogeneously distributed. The indenter template 103 may include at least one indenter structure 107, for example, at least two indenter structures, including an array of indenter structures extending from the bulk of the patterned template. The at least one indenter structure may be arranged as an array 105 of indenter structures 107. The indenter structure may be a patterned structure such as a single monolithic template comprising at least one window, for example, a plurality of windows (such as apertures extending at least partially through the template). The layer 101 may comprise a compound semiconductor. The indenter template 103 may comprise a metal, an insulator or a semiconductor.

As shown in FIG. 1B, the method may include contacting the layer 101 and the at least one indenter structure 107 of indenter template 103. The layer 101 and the indenter template 103 may be pressed together via an externally provided pressure 109. In an example, the pressure 109 may be of a magnitude sufficient to generate a periodic surface stress pattern in the layer 101, which may correspond to elastically deformed portions of the layer, but without generating plastic deformation of the layer 101. In other words, the at least one indenter structure 107 is pressed against the layer 101 with a pressure sufficient to elastically deform the layer 101. In an example, a pressure of about 15 GPa or greater may be applied against the layer 101, for example a pressure selected in the range of from about 15 GPa to about 45 GPa may be applied, and may generate a periodic surface stress pattern in layer 101 corresponding to an elastic deformation of portions of the layer 101.

The method may include annealing at least the layer 101 by exposing it to an elevated temperature 113 as shown in FIG. 1B. For example, the layer 101 may be annealed 113 while it is in contact with the template, including while pressure 109 is still applied, in order to create a patterned redistribution of atoms in the layer 101. While not limited to any particular theory, it is believed that the compressive stress generated locally in layer 101 beneath a given indenter of the template 103 will drive larger ones of the atoms (i.e., the first atoms) away from and/or draw the smaller ones of the atoms (i.e., the second atoms) toward these regions (e.g., in the case of an SiGe layer, Ge atoms will diffuse away from these regions and/or Si atoms will diffuse toward these regions). When the layer 101 and the indenting template 103 are brought into physical contact, a compressive stress generated adjacent to the indenter structures 107 of the indenting template 103 may result in a redistribution of the atoms in the layer 101, and may form a concentration gradient wherein a concentration of the larger atoms in layer 101 at regions adjacent the indenters 107 is less than a concentration of the smaller atoms, and a concentration of the larger atoms in layer 101 at regions between the indenters is higher than a concentration of the smaller atoms. Thus, a stress-induced diffusion resulting from contacting the layer 101 with the indenter structures 107 of template 103 with a pressure sufficient to cause elastic deformation of the layer 101 will form larger atom-rich regions 111 in layer 101 between indenter structures 107 and smaller atom-rich regions 111' in layer 101 adjacent to where the at least one indenter structure 107 contacts layer 101. As a result of contacting the layer 101 and the template 103, pressing them together to elastically deform the layer 101, and annealing the layer 101, the composition of layer 101 becomes inhomogeneous. That is, the first atoms and second atoms may become inhomogenously distributed in the layer.

As shown in FIG. 1C, in one embodiment the method includes forming at least one quantum confined structure, for example at least one nanostructure such as at least one quantum dot or at least one quantum well. The at least one quantum confined structure in FIG. 1C is shown as at least one nanostructure 117. The at least one nanostructure 117 may be grown on the layer 101. The at least one nanostructure 117 may be arranged in as an array 115 of nanostructures 117, for example, a 2-dimensional array of nanostructures 117, on a surface of the layer 101, but the embodiments are not so limited. For example, in some embodiments, the at least one quantum confined structure may be formed within the layer 101, as described further below for FIG. 9. In some embodiments, the at least one quantum confined structure may be formed both within the layer 101 and on a surface of the layer 101 (not shown).

Figure 3:
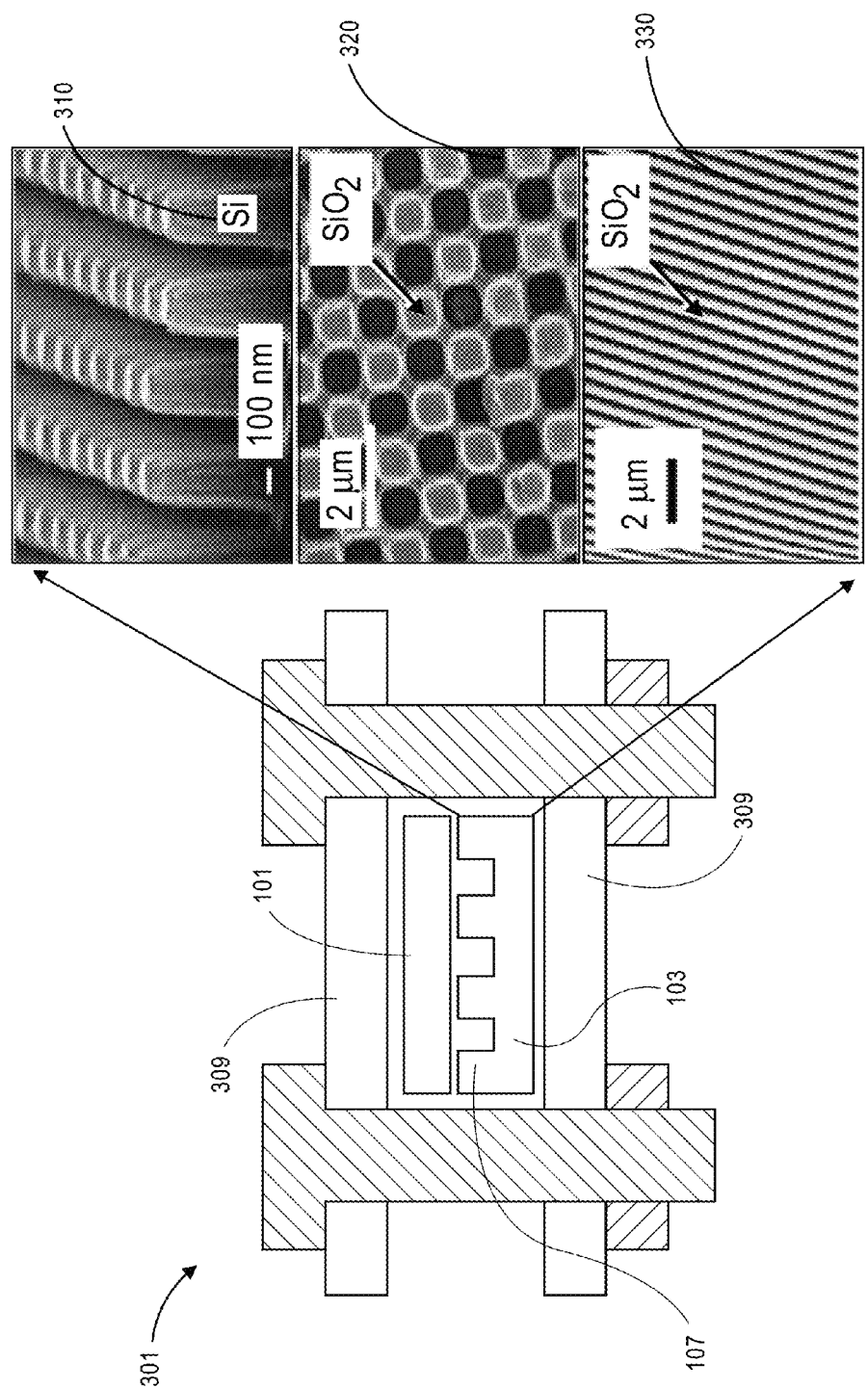
FIG. 3 is a cross-sectional view of a layer (e.g., a SiGe Substrate) and an indenter template comprising an array of indenters as they are pressed together in a fixture according to a method of an embodiment. The insets are images of different indenter patterns, including pillars, windows and trenches.

The layer 101 and the at least one indenter structure 107 may be brought into contact such that at least a portion of the indenter template 103 may cover at least a portion of the layer 101 as shown in FIG. 3, and may be pressed against layer 101 so as to elastically deform the layer 101. The assembly in FIG. 3 may then be subjected to increased temperature so as to anneal the layer 101. After annealing, the template 103 may be moved such that previously covered portions of the layer 101 may be exposed so that the nanostructures, such as quantum dots, are grown thereon via molecular beam epitaxy (MBE). In an example, the beam may comprise the same element as the large atoms in layer 101. The quantum dots may grow on surface portions of layer 101. In an embodiment, the quantum dots may grow on layer 101 at locations adjacent to where the indenter structures contact the layer 101, such as locations adjacent to surface portions of layer 101 elastically deformed by the indenter structures. These locations may be surface portions above small-atom rich regions of layer 101; i.e., small-atom rich regions where some of the large atoms of layer 101 have been depleted via their stress-induced diffusion away from regions in which the indenter structures are pressed against and elastically deform layer 101.

In another embodiment, a method for forming nanostructures may include arranging the first atoms in the layer comprising the first atoms and second atoms to form at least one quantum dot. The quantum dots may be formed without the need for a separate growth step, such as without the need for growth by MBE.

Figure 9A:
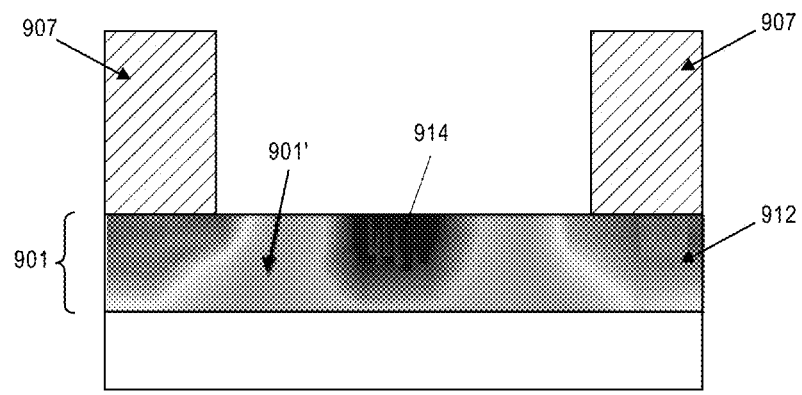
FIGS. 9A and 9B are diagrams showing an embodiment in which an indenter template comprising at least one indenter structure is pressed against the surface of a layer comprising first and second atoms (e.g., Si and Ge atoms in an SiGe layer), and thereby arranging the first atoms to form at least one quantum dot. A barrier layer (e.g., a dielectric substrate) is provided so as to prevent the first atoms from moving in a vertical direction and also to provide a quantum barrier.
Figure 9B:
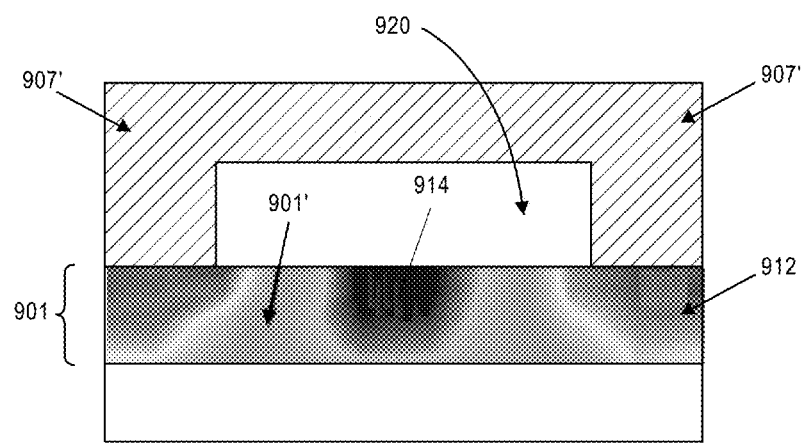

In an embodiment the a first atoms are larger than the second atoms, and may be arranged to form quantum confined structures, for example, nanostructures, such as quantum wells and/or quantum dots, by virtue of the stress-induced diffusion/movement of at least some of the first atoms into first-atom rich regions and/or at least some of the second atoms into second-atom-rich regions as described above. The first atoms in the first-atom rich regions may, therefore, be arranged to define a quantum confinement structures whose bandgaps are narrower than that of surrounding materials of the layer. For example, as shown in FIGS. 9A-9B, a layer 901 is provided. Layer 901 may comprise the same or different features as layer 101 of FIG. 1A. An indenter template comprising at least one indenter structure 907, 907' may also be provided. The indenter may comprise the same or different features as indenter template 903 of FIG. 1A. The at least one indenter structures may be pressed against a surface of layer 901, forcing the first atoms of layer 901 to diffuse into a first atom-rich region 914 between the indenter structures, to form quantum confined structures, for example, nanostructures such as quantum dots and/or quantum wells. As a result, layer 901 is changed from having a first distribution of the first and second atoms, for example, a homogeneous distribution of the first atoms and second atoms, to having a second distribution of the first and second atoms, for example, an inhomogeneous distribution of the first atoms and second atoms, such as having first atom-rich region 914, second atom-rich region 912 and region 901' in which the first and second atoms remain in a substantially homogeneously distribution. Additionally, a quantum barrier may be formed by disposing the layer 901 on another layer 916, such as a dielectric layer which may comprise $SiO_2$. Thus layer 901 may be disposed over a bulk semiconductor substrate (not shown) with the dielectric layer 916 disposed between layer 901 and the bulk semiconductor substrate. Forming the nanostructures according to the stress-induced methods described herein may also include providing the dielectric layer 916, which may serve to block the larger atoms in layer 901 from diffusing to an underlying bulk semiconductor. The indenter template in FIG. 9A may include at least one indenter structure 907, for example at least two closely placed indenter structures, including a plurality of indenter structures that may be arranged in two dimensional array. The indenter template in FIG. 9B may be a single monolithic template with one or more windows cut out. For example, the indenter template in FIG. 9B may include at least one indenter structure 907', for example, an indenter structure and at least one window 920 that may extend at least partially through the indenter template, and may be provided as a plurality of windows which may be arranged as an array of windows.

Layer Comprising First Atoms and Second Atoms

The material the layer is made of need not be limited, so long as it comprises first atoms and second atoms, wherein the first atoms are a different size than the second atoms. For example, the layer may comprise a homogeneous compositional distribution of first and second atoms, wherein the first atoms may be of a different size than a size of the second atoms. In one embodiment, the first atoms are larger than the second atoms. The layer may comprise a compound semiconductor, for example, a semiconductor alloy. Exemplary compound semiconductors include $Si_{1-x}Ge_x$, wherein x is greater than 0 and less than 1, group III-V semiconductors, and group II-VI semiconductors. In an embodiment, the layer may comprise a heteroepitaxial layer. For example, the layer may comprise InGaAs disposed over a GaAs substrate. The layer may be grown or purchased. In one embodiment, the layer may include p-type doped ($\sim 5$ Å$\sim 10^{17}$ cm$^{-3}$) $Si_{0.8}Ge_{0.2}$ substrates available from IQE Silicon (IQE plc of Cardiff, UK). The layer may have a thickness in a range of between just a few nm to about 1 mm, for example a thickness of less than about 10 nm including a thickness in the range of about 2 nm to about 3 nm. The layer's surface may be substantially planar after the annealing and prior to forming the two-dimensional array of semiconductor quantum dots thereon.

Indenter Template

The material of the indenter template need not be limited. The indenter template may comprise a metal, an insulator (dielectric), or a semiconductor. In an embodiment the indenter comprises $SiO_2$ or a metal oxide, for example, $Al_2O_3$. The indenter template may include a patterned array of indenter structures that extend from a surface of the template. In an example, the patterned array may include a nanopatterned array, wherein the indenter structures may be nanoindenter structures defined by at least one physical dimension smaller than or equal to about 100 nm. Each of the nanoindenter structures may be separated from one another by a distance of less than or equal to about 100 nm. In an embodiment, the indenter template may be a patterned Si wafer.

The indenter structures may comprise pillars that extend from the indenter template or may comprise windows and/or trenches which are formed, for example, via etching or patterning of the indenter template. The indenter template comprising the nanopatterned array of indenter structures may be fabricated by interferometric lithography (IL) and conventional dry etching. The IL technique allows fabricating a 2D array of sub-wavelength-size features, using light interference. The indenter template may be a reusable component. That is, the indenter template may be reused for patterning several ones of the layer comprising the first atoms and the second atoms. The indenter structures may be the same material or a different material than a bulk portion of the template. The indenter structures may comprise a metal, an insulator or a semiconductor.

To prevent potential wafer bonding between the layer and the indenter template, and to minimize atomic-level damage to the layer surface, a thin layer of oxide may be grown on the layer comprising the first and the second atoms, and/or a metal layer may be coated on a surface of the indenter template.

Annealing

The annealing may be performed at a temperature in the range of about 900° C. to about 1000° C., for example as the indenter template and the layer comprising the first atoms and the second atoms are pressed together at a pressure of about 15 to about 45 GPa for a time sufficient to create a patterned redistribution of the first and second atoms in the layer, for example, about 3 hrs. The annealing may be performed in a nitrogen environment to prevent oxidation. While not limited to any particular theory, it is believed that annealing the layer that includes the first atoms and second atoms under an applied periodic stress field imposed by a patterned indenter array of the indenter template will produce an equivalent pattern in the near-surface compositional distribution in the layer such as a compositional pattern via, for example, stress transfer. For example, it is believed that compressive stresses generated below the indenters will favor the presence of the smaller atomic species (Si in the case of an $Si_{1-x}Ge_x$ substrate). The atomic redistribution will be driven by diffusion within the solid solution, which is mediated by vacancy and self-interstitial point defects. The desired equilibrium distribution of atoms in the near surface region of the layer may be determined by the corresponding phase diagram and the annealing temperature.

Contacting the Layer and the Indenter Template

The layer comprising the first and second atoms and the indenter template may be brought into contact with one another, for example, by pressing them together. The pressure at which the layer and indenter template are pressed together must be selected to cause sufficient stress to the layer to induce a compositional redistribution but without causing substantial plastic deformation of the layer. That is, the pressure at which the layer and the indenter template are pressed may induce a periodic stress field imposed by the array of indenter structures which may comprise a compressive stress in the layer at regions adjacent to a respective one of the indenter structures of the indenter template. While not limited to any particular theory, in the case of an SiGe-based substrate layer, it is believed that the compositional redistribution of Si and Ge near the substrate surface will effectively transfer the indenter-generated stress pattern into the SiGe substrate by inducing a residual strain modulation at the SiGe substrate's surface. Accordingly, regions with locally higher Ge concentration will exhibit a larger effective lattice parameter at the surface than those with a depleted Ge content. Generally speaking, therefore, the resulting stress generated by pressing the layer and indenter template together induces a near-surface, periodic, two-dimensional pattern of first atom-rich and second atom-rich regions in the layer comprising the first atoms and the second atoms, wherein a concentration of the first and second atoms varies corresponding to the shape of the indenter array of the indenter template.

The magnitude of the stress required to affect compositional patterning in the layer, for example, in the case of the SiGe substrate in the example above, is related to the change in the chemical potential of Ge atoms in a Si matrix as a function of stress. Thus, the equilibrium ratio of Ge concentration in an unstrained environment relative to a compressed one (i.e. the segregation ratio) is given by $\exp(\underline{\sigma}:\underline{V}_f/kT)$, assuming that entropic factors are unaffected by stress. In the example of an SiGe substrate and while not limited to any particular theory, the formation volume, $V_f$, of a Ge atom in a silicon matrix is ~0.13 $V_{Si}$, which suggests that in order to obtain a significant equilibrium compositional variation at 800-1000° C. (i.e. segregation ration <0.33) pressures on the order of GPa would be required. This range will vary depending on the temperature at which the annealing is performed.

As described above, such a stress must be imposed on the layer comprising the first atoms and the second atoms without substantial elastic deformation. Additionally, such a stress must be imposed on the layer without creating large concentrations of highly mobile dislocations. A rough upper bound can be estimated based on the critical stress required to homogeneously nucleate dislocation loops, $\sigma_c = G/2\pi r_c$, where G is the shear modulus (GPa) and is the radius of the critically-sized dislocation loop (of the order of a lattice parameter). Accordingly, in an example, the maximum allowable shear stress, from the point of homogeneous dislocation formation, is about 8-10 GPa, which implies a maximum allowable uniaxial stress of roughly double that, or 15-20 GPa.

Forming Nanostructures

The forming of the nanostructures can include forming at least one quantum dot. The at least one quantum dot can be formed by arranging the first ones of the atoms in the layer comprising the first and second atoms in first-atom rich regions of the layer via stress-induced diffusion caused by pressing the nanoindenters against the layer. The at least one quantum dot can also be formed by growing the at least one quantum dot by molecular beam epitaxy (MBE). In the case of MBE, quantum dots may form at larger-atom depleted regions of the layer adjacent to which the nanoindenters are pressed against the layer.

The nanostructures may be semiconductor quantum dots, including Ge and/or In quantum dots.

In the case of MBE, typical deposition temperatures and timescales to generate Ge islands are on the order 500-700° C. for several hours. While not limited to any particular theory, given the large effective activation energy for Ge diffusion, the Ge mobility within the bulk during the deposition process therefore is expected to be negligible.

While not limited to any particular theory, with respect to the layer comprising first and second atoms being comprised of SiGe, it is believed that the residual strain pattern at the substrate surface created by the inhomogeneous compositional distribution of Si and Ge will be sufficient to direct Ge dot nucleation and/or growth during subsequent deposition of Ge onto the substrate. The magnitude of the maximum strain variation will be proportional to the differential in the Ge content between the deposited film and substrate, minus any plastic relaxation via the formation of misfit dislocations.

Additional Surface Treatments

The layer comprising the first atoms and the second atoms may undergo additional surface treatments prior to forming nanostructures thereon. For example, the layer may be etched, cleaned or both.

Devices

The structures formed according to embodiments described herein may be incorporated into devices, such as semiconductor devices. In an embodiment, highly addressable emitters with predetermined locations on wafers and/or a single-photon emitter may incorporate the quantum-dot structures of an embodiment.

EXAMPLES

Example 1—Stress Transfer by Si and SiO2 Substrate

To introduce the stress into a SiGe alloy substrate, three types of reusable template substrates were fabricated from Si or $SiO_2$/Si wafers. The templates substrates were pressed against a SiGe substrate. The two pressed substrates were annealed until the resulting stress caused Si and Ge atoms to segregate, forming a large-area, 2-d array of Si-rich and Ge-rich regions. FIG. 3 shows a schematic diagram of a fixture in which a layer 101 and an indenter template 103 are contacted and pressed together. The inset shows three types of pattern templates for the at least one indenter structure 107: a template having at least one indenter structure comprising a pillar 310 extending from a surface of the template serving as a "positive" template, template having at least one indenter structure comprising a window 320 that may extend through the template serving as a "negative" template, and a template having an indenter structure comprising a trench 330 serving as a "line" template.

The features shown in FIG. 3 are examples only, and the features generally shown therein may be reduced in size to the 50-nm-level (comparable to the size of Ge huts), using a deep UV laser at 244 nm and immersion lithography. Because these templates will be reusable, e-beam lithography may also be used for fabrication, if necessary.

The template substrate 103 and the SiGe alloy substrate 101 are shown in FIG. 3 being pressed together using a mechanical press 301 made of MACOR. This machinable glass-ceramic provides good thermal conductivity (1.46 W/m-K), good thermal stability (up to 1000° C.), and low thermal expansion ($93 \times 10^{-7}$ m/m-K) which are ideal properties for the proposed process. To prevent potential wafer bonding and to minimize atomic-level damage to the SiGe substrate surface, the indenter template's surface may be coated with a metal (e.g., Cr and Au) and/or a thin layer (<<10 nm) of oxide may be grown on the SiGe substrate. The thickness of the thin oxide layer may be kept well below 10 nm, which may correspond to a characteristic length of stress penetration into the SiGe substrate. The thin oxide may be removed prior to Ge deposition, using a dilute buffered HF solution treatment.

Example 2—Quantum Dot Growth Via MBE

After the stress transfer annealing step, the SiGe substrate was treated with a dilute buffered HF solution, rinsed in deionized H2O, blow-dried with $N_2$, and immediately loaded into a deposition chamber. The SiGe substrate was then heated under vacuum to 600° C. to desorb possible organic contaminants. Ge was then deposited either in a molecular beam epitaxy (MBE) chamber having a base pressure of approximately $5 \times 10^{-10}$ Torr or in a scanning tunneling microscope (STM) analysis chamber having a base pressure in the low $10^{-10}$ Torr range. For the MBE system, a dual filament effusion cell with a manually operated shutter was used as a Ge source. The effusion cell temperature varied within the range of from 1000° C. to 1200° C. For instance, the effusion cell temperature was set to produce a flux of $1.9 \times 10^{14}$ atoms/cm²-s (19.1 ML/min). Ge flux was calibrated by measuring the Ge film thickness on Si substrate held at room temperature, assuming that 100% of Ge adsorbs onto Si and subsequently onto Ge. After opening the shutter, the time of deposition and effusion cell temperature were recorded, and the film thickness was measured from cross-sectional SEM images. The flux was found to be reproducible within ±5% at a given effusion cell temperature. For a small effusion basket in the STM chamber, a similar mechanism was used to control the Ge flux and exposure time.

Example 3—Surface Characterization of Nanoindented SiGe Wafer

Figure 4:
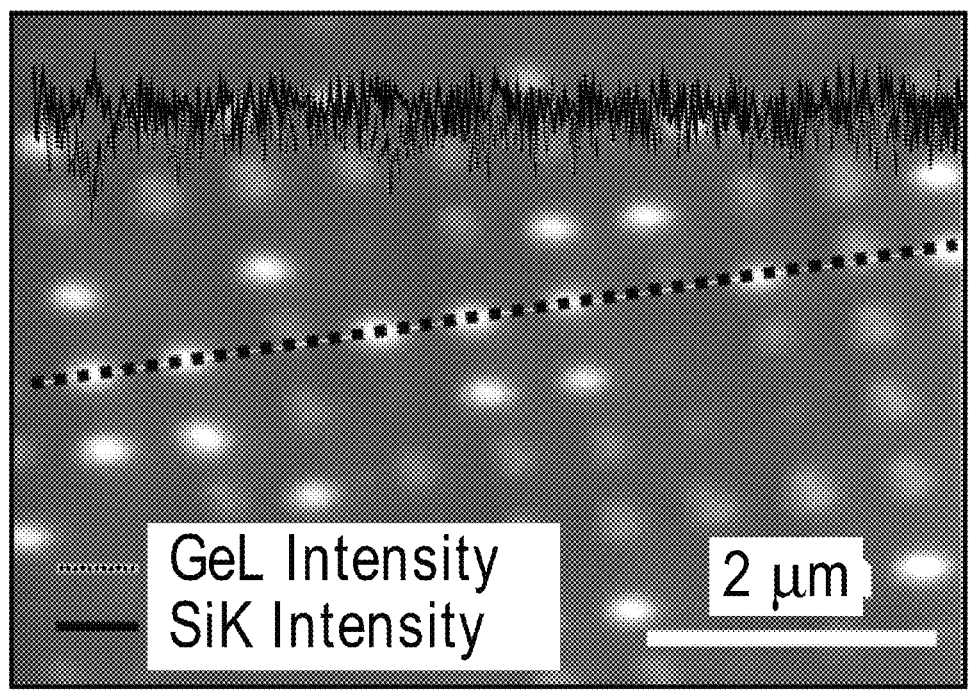
FIG. 4 is a scanning electron micrograph image of a SiGe substrate after nanoindentation caused by pressing an SiGe substrate and an Si indenter template substrate together.

FIG. 4 shows a scanning electron micrograph image of a 8 μm by 6 μm surface area of SiGe wafer after nanoindentation with an indenter template comprising an array of nanoindenters. The Si indenter pitch is 420 nm. This experiment was performed inside a furnace under 1 atm $N_2$ and temperature of 1000° C. The energy dispersive x-ray (EDX) spectroscopy was used to analyze atomic percentage of SiK and GeL components on indented SiGe wafer. Here, the EDX beam followed the dotted black line that is drawn over several indented spots, and simultaneously plotted SiK (blue line) and GeL (green line) intensity lines, while the beam follows the line starting from left side of the sample to right side.

Figure 5B:
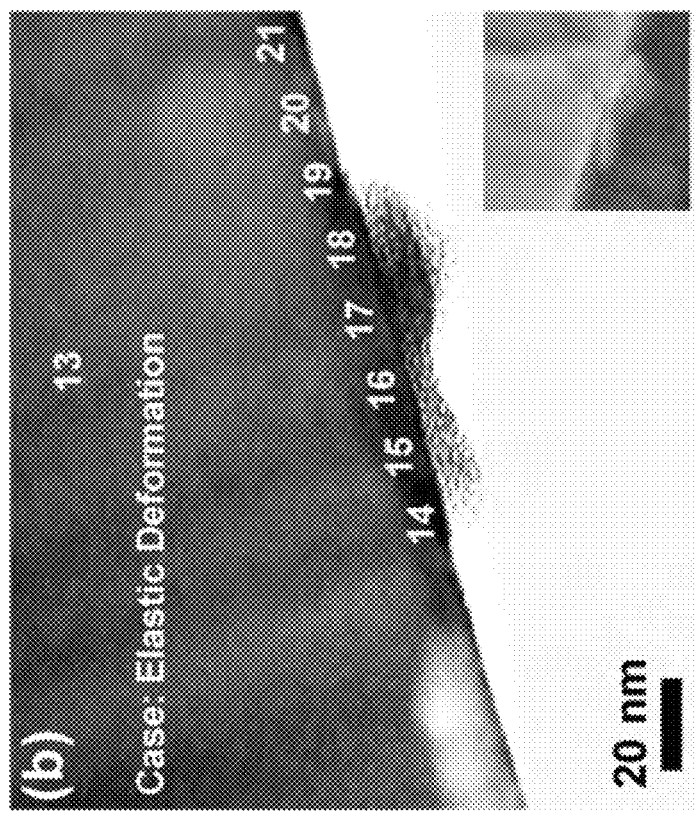
FIGS. 5A-5B are cross-sectional scanning transmission electron micrographs of an SiGe substrate surface indented according to a method of an embodiment and shown in the case of plastic deformation (FIG. 5A) and in the case of elastic deformation (FIG. 5B).
Figure 5A:
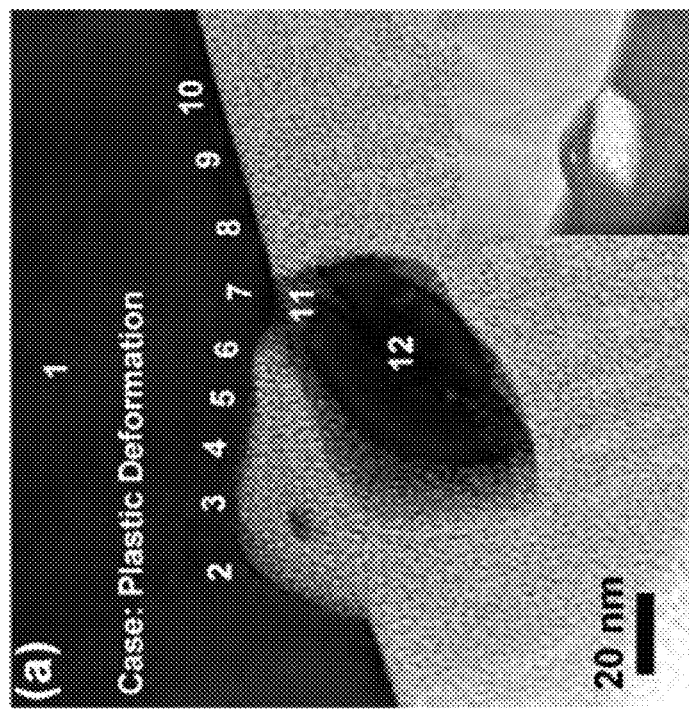

FIG. 5A is a cross-sectional scanning transmission electron micrograph image of a indented SiGe surface that is deformed plastically. The plastic deformation underneath an indenter is visible. The energy dispersive x-ray (EDX) tool was used for analyzing atomic percentage of SiK and GeL components in several spots over and around the indented SiGe wafer. The EDX beam spot area is 5 nm by 5 nm in dimension. The elliptical shaped shaded portion adjacent to the plastically deformed area is a Si leftover from the Si indenter. The inset of FIG. 5A shows that a stacking fault is formed at the edge of plastically deformed area. FIG. 5B is a cross-sectional scanning transmission electron micrograph image of an elastically compressed SiGe surface. The irregular shaped shaded portion adjacent to the elastically compressed area is a Si leftover from the Si indenter. The inset of FIG. 5B shows that no defect or fault exists in the vicinity of the compressed area.

Example 4—Compositional Characterization of Nanoindented SiGe Wafer

Figure 6A:
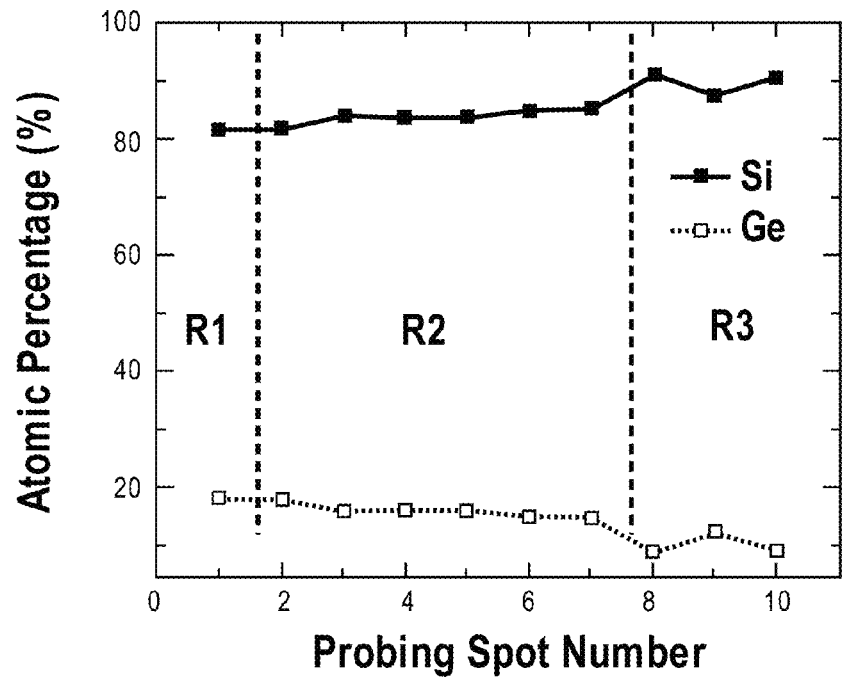
FIGS. 6A-6B are graphs showing the atomic percentage of Si and Ge as a function of probing spots in the case of plastic deformation of the SiGe substrate (FIG. 6A) and in the case of elastic deformation of the SiGe substrate (FIG. 6B).
Figure 6B:
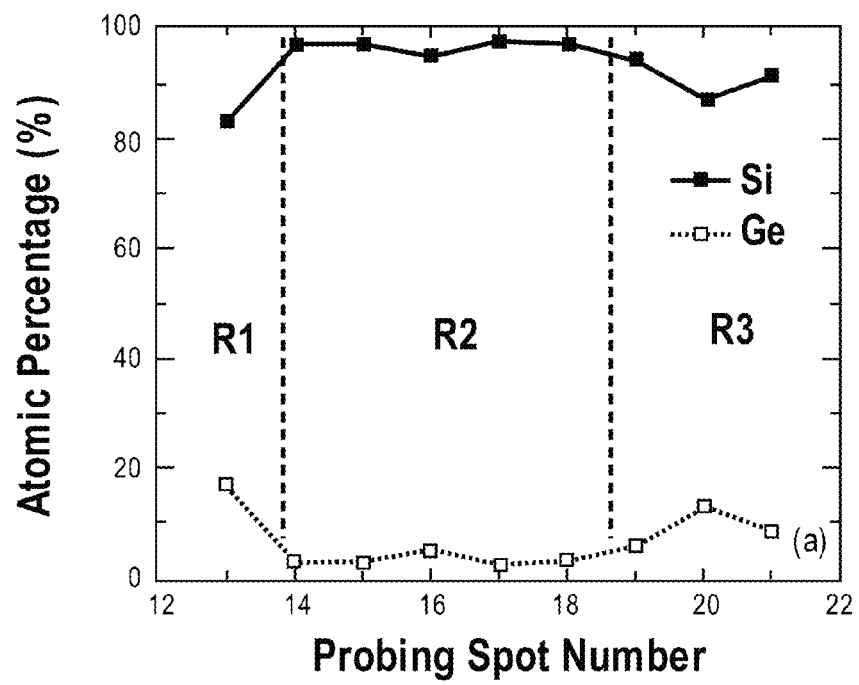

FIG. 6A is a graph showing (a) atomic percentage of Si and Ge as a function of the corresponding probing spots numbered 1-10 as shown in FIG. 5A in the case of plastic deformation. R1, R2, and R3 indicate three different regions, where R1 is a probing spot in the bulk SiGe, R2 consists of probing spots over and around the indented area, and R3 consists of probing spots away from the indented area but near the surface. Around the indented area (R2), the Si atomic percentage increases by only 3% compared to the bulk (R1) Si atomic percentage. FIG. 6B is a graph showing atomic percentage of Si and Ge as a function of the corresponding probing spots numbered 13-21 as shown in FIG. 5B in the case of elastic deformation. A 17% enrichment of Si atomic percentage occurs in R2 in comparison to R1 when indentation causes elastic deformation. The atomic percentage of Ge in R2 reveals approximately 83% depletion compared to the bulk. However, the projected enrichment of Ge is not observed in R3, which is the immediate vicinity of R2.

Example 5—Compositional Redistribution of Si and Ge Atoms in a SiGe Substrate without Subsequent Ge Beam Exposure Needed to Grow Quantum-Dots Compositional redistribution of Si and Ge atoms in a near-surface region of an SiGe substrate was performed by applying a spatially structured compressive stress to the substrate and thermally annealing the substrate while under stress according to the arrangement depicted in FIG. 7A and the process flow diagram illustrated in FIG. 7C. For example, in FIG. 7A, a mechanical press assembly comprising opposing molybdenum (Mo) presses 709 was used to contact an indenter template 703 comprising an array 705 of nanoindenters 707 to a surface of an SiGe substrate layer 701 in order to induce compressively stressed regions 711 which caused larger ones of the atoms in the substrate layer—in this case, the Ge atoms—to diffuse away therefrom and form larger-atom rich regions in the layer 701.

The indenter template, a close-up SEM image of which is shown in FIG. 7B, was formed from an Si substrate using interferometric lithography and dry etching. As shown, the indenter template included indenter structures arranged as a 2-dimensional array of cylindrical nanoindenters (80 nm diameter and 250 nm pitch) having hemispherical tips. As shown in FIG. 7C, the nanoindenters 707 of indenter template 703 were pressed (as indicated by arrows 709) against the layer 701 between the molybdenum plates 709' of the mechanical press to induce regions of elastic compressive stress 711 in layer 701. The whole assembly of FIG. 7A was then annealed at an elevated temperature (about 900° C. to 1000° C.). During this annealing, the Ge atoms diffused away from the elastically compressed region 711 underneath each indenter, leaving a 2D array of nanoscale regions that were nearly 100% Si (Si-rich regions), or viewed another way, an array of almost completely Ge-depleted regions beneath the indenters in the areas of residual tensile stress 711 as verified by cross-sectional transmission electron microscopy (XTEM) as described below.

Example 6—Compositional Map of SiGe Layer

Figure 8A:
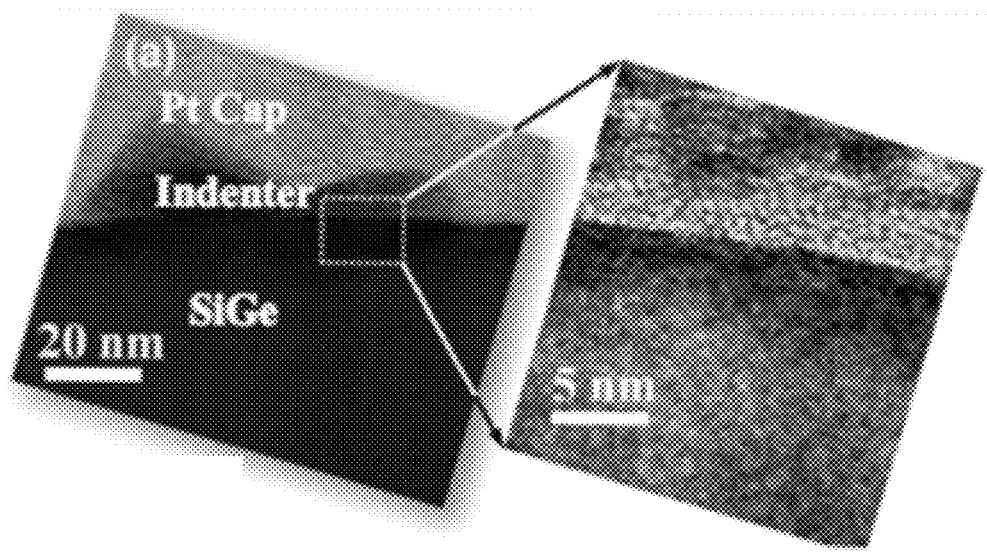
FIGS. 8A-8B are cross-sectional transmission electron microscope (XTEM) images of an indenter-substrate interface (FIG. 8A), such as after causing compositional redistribution according to FIG. 7C, and a corresponding compositional map, showing near-complete Ge depletion under the nanoindenters.
Figure 8B:
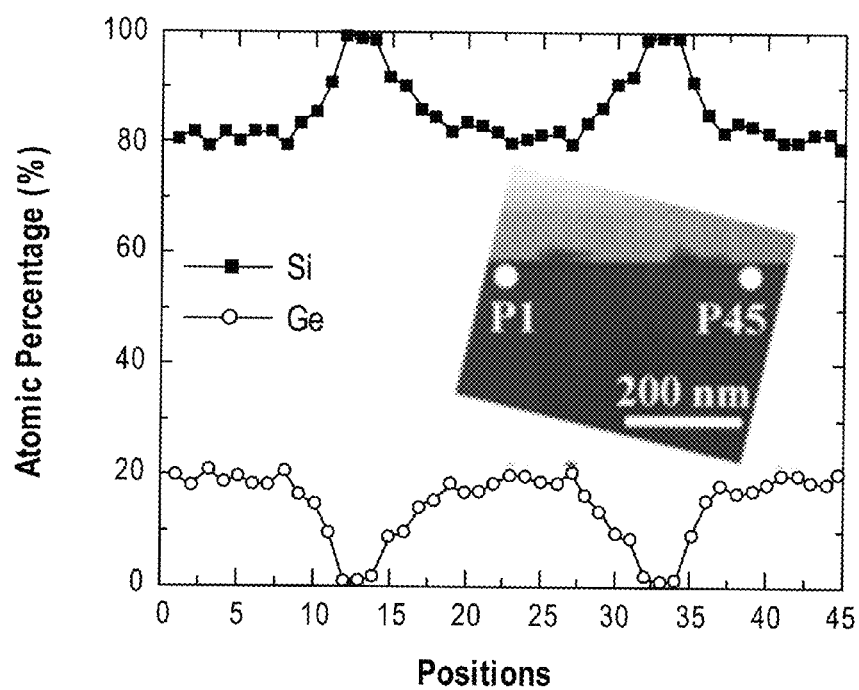

FIG. 8A shows high-resolution, cross-sectional transmission electron microscopy (XTEM) images of the resulting SiGe region of layer 701 in FIGS. 7A and 7C as described in Example 5 above. The image shows an area of the SiGe layer underneath one of the indenters and includes a magnified view (inset) showing the absence of plastic deformation and associated defects (i.e., stacking faults and dislocations). FIG. 8B shows results of an EDS analysis for elemental composition performed along the elastically compressed region near the indenter-substrate interface, labeled 'P1' to 'P45'. The analysis revealed that only elastic deformation caused compositional distribution whereas plastic deformation and defect formation did not result in changes in composition. The analysis also reveled complete Ge depletion (or Si enrichment) occurred over a wide operating window of stress (17-30 GPa) and temperature (900-1000° C.). Additionally, the results revealed that indenter tip shape and annealing time can play a significant role in defining the exact spatial geometry of quantum structures formed in the layer.

While the present teachings have been illustrated with respect to one or more implementations, alterations and/or modifications may be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages may be added or existing structural components and/or processing stages may be removed or modified.

The terms "at least one of" and "one or more of" for example, A, B, and C, are used herein to mean one or more of the listed items may be selected, and can mean any of the following: either A, B, or C alone; or combinations of two, such as A and B, B and C, and A and C; or combinations of three A, B and C. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising."

In the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein.

The term "about" indicates that the value listed may be somewhat altered, as long as the alteration does not result in nonconformance of the process or structure to the illustrated embodiment. Finally, "exemplary" indicates the description is used as an example, rather than implying that it is an ideal.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a two-dimensional array of semiconductor quantum confined structures, comprising:
   providing a layer comprising first atoms and second atoms, the first atoms having a different size than the second atoms;
   providing an indenter template comprising at least one indenter structure extending from a surface of the indenter template;
   contacting the layer and the at least one indenter structure together with a pressure sufficient to generate an elastic deformation in the layer but without generating plastic deformation of the layer; and
   annealing the layer;

wherein the contacting comprises forming at least one quantum confined structure in the layer.

2. The method of claim 1, wherein the at least one quantum confined structure comprises a bandgap that is narrower than a bandgap of adjacent portions of the layer.

3. The method of claim 1, wherein the elastic deformation comprises a periodic surface stress pattern within the layer.

4. The method of claim 1, wherein the at least one quantum confined structure comprises a first atom-rich region of the layer having a higher concentration of first atoms relative to a second atom-rich region of the layer, the second atom-rich region of the layer located at elastically deformed portions of the layer.

5. The method of claim 1, wherein the at least one quantum confined structure comprises at least one quantum dot or at least one quantum well.

6. The method of claim 1, wherein the at least one quantum confined structure comprises a plurality of quantum confined structures arranged in a 2-dimensional array.

7. The method of claim 1, wherein the layer comprises a homogeneous compositional distribution of the first atoms and the second atoms before the contacting and comprises an inhomogeneous compositional distribution of the first atoms and second atoms after the contacting.

8. The method of claim 1, wherein the layer comprises a compound semiconductor.

9. The method of claim 1, wherein the layer comprises Si1-xGex, where x is greater than 0 and less than 1.

10. The method of claim 1, wherein the layer comprises InGaAs.

11. The method of claim 1, wherein the indenter template comprises a metal, an insulator, or a semiconductor.

12. The method of claim 1, wherein providing the layer comprises growing the layer over a bulk semiconductor substrate.

13. The method of claim 12, further comprising forming a dielectric layer between the layer and the bulk semiconductor substrate.

14. The method of claim 1, wherein the elastic deformation comprises a periodic surface stress pattern within the layer, and wherein the periodic stress pattern comprises a compressive stress in the layer that induces diffusion of at least some of the first atoms to form the at least one quantum confined structure.

15. The method of claim 1, wherein the at least two indenter structures comprise a plurality of indenter structures arranged in a two-dimensional array, and wherein the plurality of indenter structures comprise pillars, windows, trenches or combinations thereof.

16. A method for forming a two-dimensional array of semiconductor quantum dots, comprising:
    providing a layer comprising first atoms and second atoms, the first atoms having a different size than the second atoms;
    providing an indenter template comprising a nanopatterned array of indenter structures extending from a surface of the indenter template;
    contacting the layer and the nanopatterned array of indenter structures together with a pressure sufficient to elastically deform portions of the layer but without generating plastic deformation of the layer; and
    annealing the layer;
    wherein the layer comprises a homogeneous compositional distribution of the first atoms and the second atoms before the contacting and comprises an inhomogeneous compositional distribution of the first atoms and second atoms after the contacting.

17. The method of claim 16, further comprising growing at least one quantum dot on a surface of the layer elastically deformed by the indenter structures.

18. The method of claim 17, wherein the at least one quantum dot is grown by molecular beam epitaxy (MBE).

19. The method of claim 17, wherein the at least one quantum dot comprises a plurality of quantum dots arranged in a 2-dimensional array on the layer.

20. The method of claim 17, wherein the at least one quantum dot comprises at least one semiconductor quantum dot.

21. The method of claim 16, wherein the layer comprises a compound semiconductor.

* * * * *